United States Patent
Yamamichi et al.

(10) Patent No.: US 9,362,263 B2
(45) Date of Patent: Jun. 7, 2016

(54) SEMICONDUCTOR DEVICE

(71) Applicant: Renesas Electronics Corporation, Tokyo (JP)

(72) Inventors: Shintaro Yamamichi, Kanagawa (JP); Kenta Ogawa, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/851,696

(22) Filed: Sep. 11, 2015

(65) Prior Publication Data

US 2016/0005727 A1 Jan. 7, 2016

Related U.S. Application Data

(63) Continuation of application No. 14/284,476, filed on May 22, 2014, now Pat. No. 9,165,879.

(30) Foreign Application Priority Data

Jun. 6, 2013 (JP) ................. 2013-119998

(51) Int. Cl.
*H01L 23/04* (2006.01)
*H01L 23/34* (2006.01)
(Continued)

(52) U.S. Cl.
CPC ............. *H01L 25/18* (2013.01); *H01L 21/561* (2013.01); *H01L 23/3135* (2013.01); *H01L 23/481* (2013.01); *H01L 23/49838* (2013.01); *H01L 23/50* (2013.01); *H01L 24/17* (2013.01); *H01L 24/97* (2013.01); *H01L 25/0657* (2013.01); *H01L 25/50* (2013.01); *H01L 23/12* (2013.01); *H01L 23/49816* (2013.01); *H01L 23/49822* (2013.01); *H01L 24/05* (2013.01); *H01L 24/06* (2013.01); *H01L 24/13* (2013.01); *H01L 24/14* (2013.01); *H01L 24/16* (2013.01);
(Continued)

(58) Field of Classification Search
CPC ............ H01L 23/49838; H01L 23/481; H01L 2924/01079; H01L 2224/48091; H01L 23/5226
USPC .......... 438/106, 107, 109, 118, 119; 257/678, 257/684, 698, 707, 723, 734, 774
See application file for complete search history.

(56) References Cited

U.S. PATENT DOCUMENTS

| | | | |
|---|---|---|---|
| 7,145,247 B2 | 12/2006 | Kawano et al. | |
| 8,873,245 B2 | 10/2014 | Kim et al. | |
| 2013/0093100 A1 | 4/2013 | Shariff et al. | |

FOREIGN PATENT DOCUMENTS

| | | |
|---|---|---|
| JP | 2005-183934 A | 7/2005 |
| JP | 2011-243724 A | 12/2011 |

*Primary Examiner* — Hsien Ming Lee
(74) *Attorney, Agent, or Firm* — Shapiro, Gabor and Rosenberger, PLLC

(57) ABSTRACT

This invention can reduce heat that is generated in a first semiconductor chip and transfers to a second semiconductor chip through through-silicon vias. The first semiconductor chip has the first through-silicon vias. Each of the first through-silicon vias is arranged on any of grid points arranged in m rows and n columns (m>n). The first semiconductor chip also has a first circuit formation area. A first circuit is formed in the first circuit formation area. The first circuit performs signal processing while communicating with the second semiconductor chip. In plan view, the first circuit formation area does not overlap with a through-silicon via area that is defined by coupling the outermost grid points arranged in m rows and n columns. In plan view, some of connection terminals are located between the first circuit formation area and the through-silicon via area.

20 Claims, 13 Drawing Sheets

(51) Int. Cl.
*H01L 23/48* (2006.01)
*H01L 21/44* (2006.01)
*H01L 25/18* (2006.01)
*H01L 23/498* (2006.01)
*H01L 23/31* (2006.01)
*H01L 23/50* (2006.01)
*H01L 25/065* (2006.01)
*H01L 25/00* (2006.01)
*H01L 21/56* (2006.01)
*H01L 23/12* (2006.01)
*H01L 23/00* (2006.01)

(52) U.S. Cl.
CPC .............. *H01L 24/32* (2013.01); *H01L 24/73* (2013.01); *H01L 24/92* (2013.01); *H01L 2224/0401* (2013.01); *H01L 2224/05009* (2013.01); *H01L 2224/06181* (2013.01); *H01L 2224/131* (2013.01); *H01L 2224/13147* (2013.01); *H01L 2224/14181* (2013.01); *H01L 2224/16146* (2013.01); *H01L 2224/16148* (2013.01); *H01L 2224/16225* (2013.01); *H01L 2224/17181* (2013.01); *H01L 2224/32145* (2013.01); *H01L 2224/32225* (2013.01); *H01L 2224/73204* (2013.01); *H01L 2224/92125* (2013.01); *H01L 2224/97* (2013.01); *H01L 2225/06513* (2013.01); *H01L 2225/06517* (2013.01); *H01L 2225/06544* (2013.01); *H01L 2225/06555* (2013.01); *H01L 2225/06589* (2013.01); *H01L 2924/143* (2013.01); *H01L 2924/1431* (2013.01); *H01L 2924/1432* (2013.01); *H01L 2924/1434* (2013.01); *H01L 2924/15311* (2013.01); *H01L 2924/181* (2013.01); *H01L 2924/3511* (2013.01)

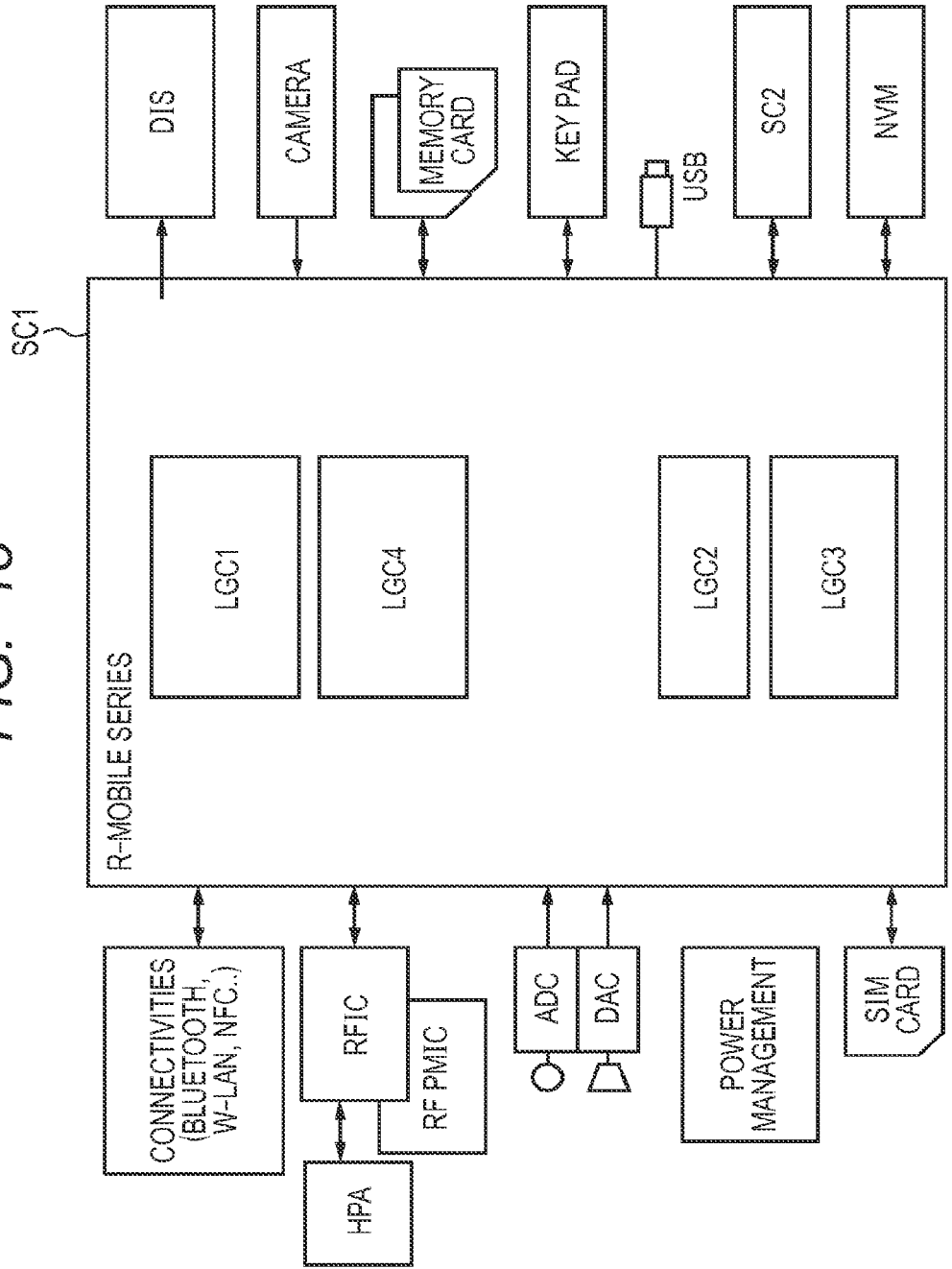

SEMICONDUCTOR DEVICE

CROSS-REFERENCE TO RELATED APPLICATIONS

The disclosure of Japanese Patent Application No. 2013-119998 filed on Jun. 6, 2013 including the specification, drawings and abstract is incorporated herein by reference in its entirety.

BACKGROUND

This invention relates to semiconductor devices, and for example, is a technique applicable to a semiconductor device in which a first semiconductor chip and a second semiconductor chip are stacked over a wiring board.

One of the methods for packaging a plurality of semiconductor chips over a wiring board employs stacking a second semiconductor chip over a first semiconductor chip. Japanese Unexamined Patent Publication No. 2005-183934 discloses a technique of coupling a second semiconductor chip to a first semiconductor chip through bumps.

On the other hand, a method for coupling a semiconductor chip to another semiconductor chip by using through-silicon vias is under study. Through-silicon vias are provided so as to pass through a substrate of the semiconductor chip along the thickness of the substrate. For example, a method disclosed in Japanese Unexamined Patent Publication No. 2011-243724 includes stacking memory chips, each having through-silicon vias formed therein, and coupling these memory chips using the through-silicon vias.

In Japanese Unexamined Patent Publication No. 2011-243724, the lowermost memory chip is coupled to a wiring board through solder bumps. Around the lowermost memory chip, a frame-like metal member is provided so as to enclose the memory chip. In addition, a metal substrate is mounted over the uppermost memory chip with an adhesive member therebetween. The frame-like member in the publication is provided in order to increase the rigidity of the wiring board.

SUMMARY

If a second semiconductor chip is mounted over a first semiconductor chip, the heat dissipation performance of the second semiconductor chip is deteriorated. Hence, the inventors of the present invention have recognized the need for preventing heat from transferring to the second semiconductor chip as much as possible. Especially in the case where the first semiconductor chip and the second semiconductor chip are coupled to each other with through-silicon vias provided in the first semiconductor chip, the inventors have recognized the need for preventing heat generated in the first semiconductor chip from transferring to the second semiconductor chip through the through-silicon vias. The other problems and novel features of the present invention will become apparent from the following description in the present specification and the accompanying drawings.

According to an embodiment, a first semiconductor chip is mounted over a first surface of a wiring board and is rectangular in plan. The first semiconductor chip has an element formation surface facing the first surface of the wiring board. The first semiconductor chip is coupled to the wiring board through connection terminals. The first semiconductor chip has a plurality of first through-silicon vias. Each of the first through-silicon vias is arranged on any of grid points arranged in m rows and n columns (m>n). A second semiconductor chip is disposed over the first semiconductor chip and is electrically coupled to the first through-silicon vias of the first semiconductor chip. The first semiconductor chip also has a first circuit formation area. A first circuit is formed in the first circuit formation area. The first circuit performs signal processing while communicating with the second semiconductor chip. In plan view, the first circuit formation area does not overlap with a through-silicon via area that is defined by coupling the outermost grid points arranged in m rows and n columns. In plan view, some of the connection terminals are positioned between the first circuit formation area and the through-silicon via area.

This embodiment can reduce the transfer of heat, which is generated in the first semiconductor chip, to the second semiconductor chip through the through-silicon vias.

BRIEF DESCRIPTION OF THE DRAWINGS

FIG. 13 is a block diagram showing the functional configuration of the electronic device shown in FIG. 12.

DETAILED DESCRIPTION

With reference to the accompanying drawings, an embodiment will be described below. Note that in all drawings like components are denoted by like numerals and therefore the explanations thereof will not be reiterated if not necessary.

[Embodiment]

Figure 1:
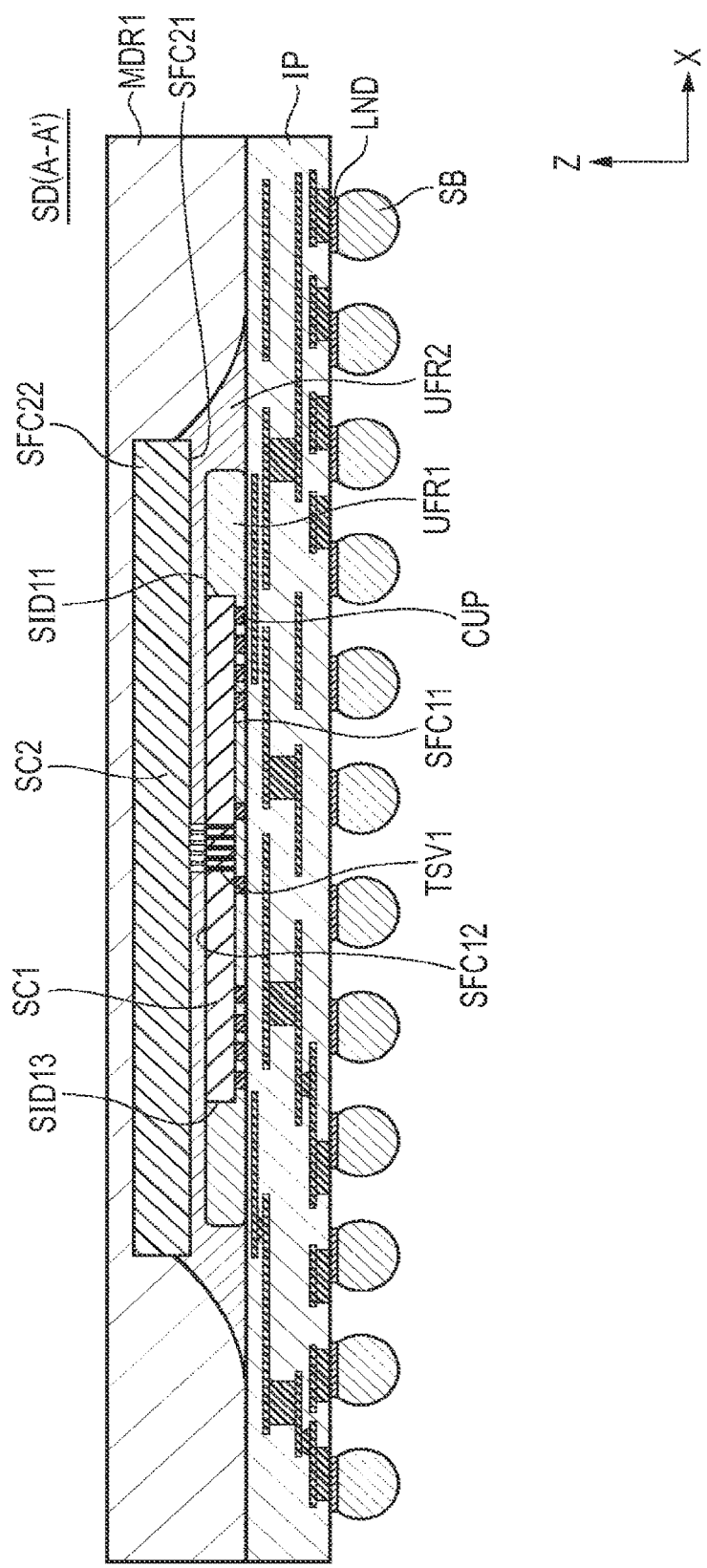
FIG. 1 is a cross-sectional view showing the configuration of a semiconductor device according to an embodiment.
Figure 2:
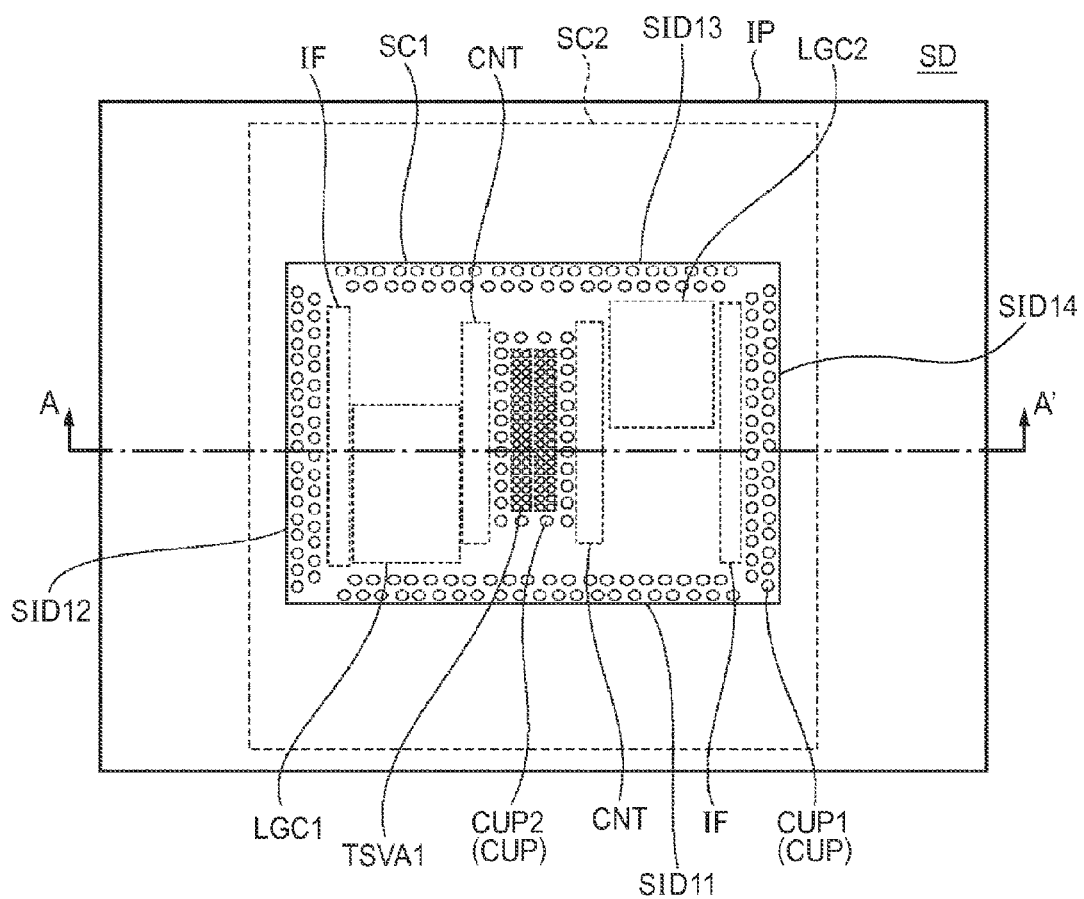
FIG. 2 schematically illustrates the relative positions of a wiring board, a first semiconductor chip, and a second semiconductor chip which form the semiconductor device.

FIG. 1 is a cross-sectional view showing the configuration of a semiconductor device SD according to the first embodiment. FIG. 2 schematically illustrates the relative positions of a wiring board IP, a first semiconductor chip SC1, and a second semiconductor chip SC2 which form the semiconductor device SD. FIG. 1 corresponds to a cross section taken along A-A' in FIG. 2. The semiconductor device SD according to the first embodiment includes a wiring board IP, a first semiconductor chip SC1, and a second semiconductor chip SC2.

The first semiconductor chip SC1 is mounted over a first surface of the wiring board IP and is rectangular in plan. The first semiconductor chip SC1 has an element formation surface SFC11 facing the first surface. The first semiconductor chip SC1 is coupled to the wiring board IP through connection terminals CUP.

The first semiconductor chip SC1 has a plurality of first through-silicon vias TSV1. Each of the first through-silicon vias TSV1 is arranged on any of grid points arranged in m rows and n columns (m>n). In the example shown in FIGS. 1 and 2, a direction in parallel with long sides SID11, SID13 of the first semiconductor chip SC1 (X-direction in FIG. 2) is defined as a column direction, and a direction perpendicular to the long sides SID11, SID13 (Y-direction in FIG. 2) is defined as a row direction. However, the row direction can be a direction in parallel with short sides SID12, SID14 of the first semiconductor chip SC1.

The second semiconductor chip SC2 is disposed over the first semiconductor chip SC1 and is electrically coupled to the first through-silicon vias TSV1 of the first semiconductor chip SC1.

The first semiconductor chip SC1 also has a first circuit formation area LGC1. A first circuit is formed in the first circuit formation area LGC1. The first circuit performs signal processing while communicating with the second semiconductor chip SC2. In plan view, the first circuit formation area LGC1 does not overlap with an area defined by coupling the outermost grid points arranged in m rows and n columns (hereinafter, referred to as a through-silicon via area TSVA1). In plan view, some of the connection terminals CUP are positioned between the first circuit formation area LGC1 and the through-silicon via area TSVA1. This arrangement allows at least a portion of heat generated in the first circuit formation area LGC1 to transfer to the wiring board IP through the connection terminals CUP. Hence, heat transferring from the first semiconductor chip SC1 to the second semiconductor chip SC2 through the first through-silicon vias TSV1 can be reduced.

As described above, the element formation surface SFC11 of the first semiconductor chip SC1 faces the first surface of the wiring board IP. This arrangement makes the second semiconductor chip SC2 less susceptible to heat from the first semiconductor chip SC1 in comparison with the case where the element formation surface SFC11 faces the second semiconductor chip SC2. This arrangement also makes it easy for heat to transfer from the first semiconductor chip SC1 to the wiring board IP.

The configuration of the semiconductor device SD will be described in detail below.

Referring to FIG. 1, the configuration of the semiconductor device SD will be described. The wiring board IP is, for example, a resin interposer having wiring layers on at least both sides. The wiring board IP may have two wiring layers or four or more wiring layers. The thickness of the wiring board IP is, for example, from 100 μm to 300 μm. However, the wiring board IP can be thicker or thinner than those thicknesses. The wiring on the side of the first surface (i.e., a side where the first semiconductor chip SC1 is mounted) of the wiring board IP includes electrodes IEL (which will be described later by referring to FIG. 3). The electrodes IEL are electrically coupled to the first semiconductor chip SC1.

The wiring board IP has a wiring layer on a second surface, which is the opposite side of the first surface, and electrodes LND are disposed over the wiring layer on the second surface. The electrodes LND are coupled to the electrodes IEL through at least coupling members provided in the wiring board IP (e.g., a conductive layer provided in a through hole). External connection terminals SB are provided over the electrodes LND. The external connection terminals SB are used to attach the semiconductor device SD to a circuit board (e.g., a motherboard). The external connection terminals SB are, for example, solder balls. The electrodes LND and external connection terminals SB are arranged at least along the edges of the wiring board IP. However, the electrodes LND and external connection terminals SB can be additionally disposed at the center of the wiring board IP. In this case, the electrodes LND and external connection terminals SB may be provided across the entire surface of the wiring board IP, or a group of the external connection terminals SB arranged at the center of the wiring board IP and a group of the external connection terminals SB arranged at the edges of the wiring board IP may have a space therebetween, which is larger than a distance between the grid points of the respective groups.

As described above, the first semiconductor chip SC1 is coupled to the electrodes IEL of the wiring board IP. In the example shown in the drawings, the first semiconductor chip SC1 is coupled to the electrodes IEL via connection terminals CUP. The connection terminals CUP are, for example, conductor posts made of metal, such as Cu. However, solder bumps can be also used as the connection terminals.

The first semiconductor chip SC1 has a thickness thinner than the wiring board IP or, for example, is half the thickness of the wiring board IP or thinner. The thickness of the first semiconductor chip SC1 is, for example, 50 μm to 60 μm, but is not limited thereto.

The first semiconductor chip SC1 is thinner than the second semiconductor chip SC2. Accordingly, the first through-silicon vias TSV1 are relatively short, thereby more easily transfer heat from the first semiconductor chip SC1 to the second semiconductor chip SC2.

Over the element formation surface SFC11 of the first semiconductor chip SC1, at least one logic circuit (e.g., a circuit in the first circuit formation area LGC1) is formed. This logic circuit is coupled to the second semiconductor chip SC2 via the first through-silicon vias TSV1.

The second semiconductor chip SC2 is, for example, a memory chip. The memory included in the second semiconductor chip SC2 may be a Wide I/O memory or a double data rate (DDR) memory (such as DDR2 and DDR3). However, the second semiconductor chip SC2 can be a semiconductor chip with a logic circuit or a semiconductor chip having both a logic circuit and a memory circuit. The second semiconductor chip SC2 has an element formation surface SFC21 facing a back surface SFC12 of the first semiconductor chip SC1.

In the example shown in FIG. 1, the through-silicon via area TSVA1 is aligned with the center of the first semiconductor chip SC1, the center of the second semiconductor chip SC2, and the center of the wiring board IP as viewed in a cross section taken along a short side of the first semiconductor chip SC1. However, the relative positions of the first semiconductor chip SC1, second semiconductor chip SC2, and wiring board IP are not limited to the example shown in FIG. 1.

The space between the first semiconductor chip SC1 and the first surface of the wiring board IP is sealed with first sealing resin UFR1. The space between the second semiconductor chip SC2 and the first surface of the wiring board IP is also sealed with second sealing resin UFR2. Consequently, the first sealing resin UFR1 is covered with the second sealing resin UFR2. The first sealing resin UFR1 may be a die attachment film (DAF) or may be formed by dripping liquid resin. The second sealing resin UFR2 is formed by, for example, dripping liquid resin.

The thickness of the first sealing resin UFR1, in other words, the distance between the first semiconductor chip SC1 and wiring board IP, is preferably less than the thickness of the second sealing resin UFR2, in other words, the distance between the first semiconductor chip SC1 and second semiconductor chip SC2. The thinner first sealing resin UFR1 allows more amounts of heat to be transferred from the first semiconductor chip SC1 to the wiring board IP, and the thicker second sealing resin UFR2 can decrease the amount of heat transferring from the first semiconductor chip SC1 to the second semiconductor chip SC2.

In addition, the thermal conductivity of the first sealing resin UFR1 is preferably higher than that of the second sealing resin UFR2. The first sealing resin UFR1 with higher thermal conductivity can further increase the amount of heat transferring from the first semiconductor chip SC1 to the wiring board IP. Consequently, the amount of heat transferring from the first semiconductor chip SC1 to the second semiconductor chip SC2 through the second sealing resin UFR2 is further decreased.

The first surface of the wiring board IP, the first semiconductor chip SC1, the second sealing resin UFR2, and the second semiconductor chip SC2 are sealed with sealing resin MDR1. In the example shown in FIG. 1, the sealing resin MDR1 has side surfaces flush with the side surfaces of the wiring board IP. However, as viewed in plan view, the side surfaces of the sealing resin MDR1 can be positioned more inwardly than the side surfaces of the wiring board IP.

With reference to FIG. 2, the configuration of the semiconductor device SD will be described. The first semiconductor chip SC1 is rectangular in plan and has a long side SID11, a short side SID12, a long side SID13, and a short side SID14. The first through-silicon vias TSV1 are located in a through-silicon via area TSVA1 defined by coupling the outermost grid points arranged in m rows and n columns, and arranged on the grid points, respectively. The through-silicon via area TSVA1 is a rectangle having long sides (i.e., the row direction) in parallel with the short sides SID12, SID14 of the first semiconductor chip SC1. The first circuit formation area LGC1 is located between a long side of the through-silicon via area TSVA1 and the short side SID12. According to this arrangement, the first circuit formation area LGC1 can be located apart from the through-silicon via area TSVA1. Among the circuits possessed by the first semiconductor chip SC1, the first circuit in the first circuit formation area LGC1 generates the greatest amount of heat. Hence, an area where the temperature rises to the highest in the first semiconductor chip SC1 is an area overlapping with the first circuit in plan view. The first circuit is, for example, a central processing unit (CPU).

The long sides of the through-silicon via area TSVA1 can be in parallel with the long sides SID11, SID13 of the first semiconductor chip SC1.

As viewed in a cross section taken along a short side of the first semiconductor chip SC1, the center (or center of gravity) of the first semiconductor chip SC1 is aligned with the center (or center of gravity) of the wiring board IP.

In addition, some of the connection terminals CUP (i.e., connection terminals CUP1) are disposed along the four sides (long side SID11, short side SID12, long side SID13, and short side SID14) of the first semiconductor chip SC1. In the example shown in FIG. 2, the connection terminals CUP1 are disposed along the four sides of the first semiconductor chip SC1 so as to form multiple lines.

Some of the connection terminals. CUP (i.e., connection terminals CUP2) are located between the first circuit formation area LGC1 and the through-silicon via area TSVA1. Due to this arrangement, at least a portion of heat generated in the first circuit formation area LGC1 can escape to the wiring board IP through the connection terminals CUP2 before reaching the first through-silicon vias TSV1. Even if stress is applied onto the first semiconductor chip SC1, the connection terminal CUP2 can prevent the through-silicon via area TSVA1 from suffering warpage. Therefore, it can be prevented that the substrate SUB1 of the first semiconductor chip SC1 becomes cracked starting from the through-silicon via area TSVA1. The connection terminals CUP2 can have a larger cross-sectional area than the connection terminals CUP1. The larger cross-sectional area of the connection terminals CUP2 increases the aforementioned effects. In the example shown in FIG. 2, the connection terminals CUP2 are arranged so as to surround the through-silicon via area TSVA1.

In plan view, the total area of the connection terminals CUP1 is larger than that of the first through-silicon vias TSV1. This makes it harder for heat to transfer from the first semiconductor chip SC1 to the second semiconductor chip SC2, while making it easier for heat to transfer from the first semiconductor chip SC1 to the wiring board IP.

At least some of the connection terminals CUP2 can be coupled to the first through-silicon vias TSV1 through the lines and vias formed in a multilevel interconnection layer MIL of the first semiconductor chip SC1. In this case, the connection terminals CUP2 directly coupled to the electrodes EL11 are coupled to a power electrode or a ground electrode of the second semiconductor chip SC2.

Other connection terminals CUP may be provided on the outside of the connection terminals CUP2. The connection terminals CUP can be also coupled to the first through-silicon vias TSV1 through the lines and vias formed in the multilevel interconnection layer MIL of the first semiconductor chip SC1. These connection terminals can be also used, for example, as terminals for testing the second semiconductor chip SC2.

The electrodes IEL over the wiring board IP are also arranged so as to correspond with the connection terminals CUP.

The second semiconductor chip SC2 extends out further than at least one side of the first semiconductor chip SC1 in plan view. In the example shown in FIG. 2, the long sides of the second semiconductor chip SC2 are in parallel with the short side SID12 of the first semiconductor chip SC1.

In a case where the second semiconductor chip SC2 is a memory chip, the first through-silicon vias TSV1 are arranged in accordance with specifications set out in JEDEC JESD 229. Accordingly, four through-silicon via areas TSVA1 are arranged in two rows and two columns. In addition, the first semiconductor chip SC1 has a control circuit formation area CNT at areas around the through-silicon via areas TSVA1 in plan view. In the control circuit formation areas CNT, a memory control circuit is formed to control the memory of the second semiconductor chip SC2. Among coupling paths for coupling the memory control circuit and the second semiconductor chip SC2, this arrangement can shorten coupling paths formed in the multilevel interconnection layer MIL of the first semiconductor chip SC1.

In plan view, a second circuit formation area LGC2 is arranged opposite to the first circuit formation area LGC1 with respect to the through-silicon via areas TSVA1. A second circuit is formed in the second circuit formation area LGC2. The second circuit generates a lesser amount of heat than the first circuit, but the amount of heat generation is greater than that of the circuits in the control circuit formation area CNT. The second circuit is, for example, a graphics processing unit (GPU).

Furthermore, in plan view, an I/O circuit IF is formed between a short side close to the first circuit formation area LGC1 (i.e., short side SID12 in FIG. 2) and the first circuit formation area LGC1. Another I/O circuit IF is formed between the connection terminals CUP1 disposed along the short side SID14 and the second circuit formation area LGC2. The amount of heat generated by the I/O circuit IF is smaller than the amount of heat generated by the second circuit, but greater than the amount of heat generated by the circuits in the control circuit formation area CNT. The I/O circuit IF is also formed between a short side close to the second circuit formation area LGC2 (i.e., short side SID14 in FIG. 2) and the second circuit formation area LGC2.

Figure 3:
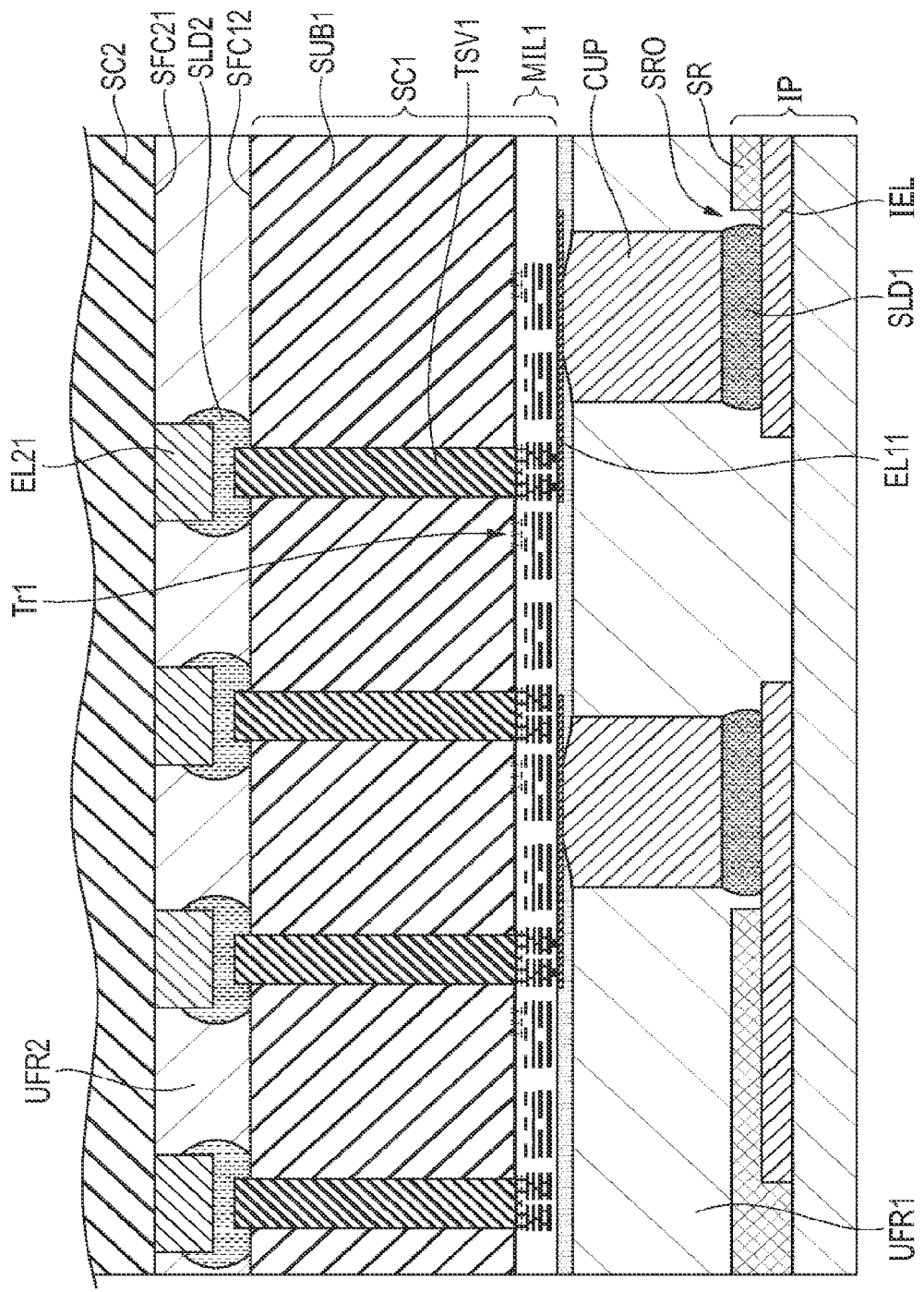
FIG. 3 is a cross-sectional view to illustrate the configuration of a part in which the first semiconductor chip is coupled to the wiring board and a part in which the first semiconductor chip is coupled to the second semiconductor chip.

FIG. 3 is a cross-sectional view to illustrate the configuration of a coupling part of the first semiconductor chip SC1 and the wiring board IP and a coupling part of the first semiconductor chip SC1 and the second semiconductor chip SC2.

The first semiconductor chip SC1 is made up with a substrate SUB1. The substrate SUB1 is a semiconductor substrate, such as a silicon substrate. Transistors Tr1 are formed over the substrate SUB1. Over the surface of the substrate SUB1 where the transistors Tr1 are formed, a multilevel interconnection layer MIL1 is formed. Various circuits of the first semiconductor chip SC1 are configured with lines in the multilevel interconnection layer MIL1 and the transistors Tr1.

First through-silicon vias TSV1 are formed in the substrate SUB1. The first through-silicon vias TSV1 are made of a conductive material, such as copper, so as to pass through the substrate SUB1. An insulating film (not shown) is formed between the first through-silicon vias TSV1 and the substrate SUB1.

Over the uppermost wiring layer of the multilevel interconnection layer MIL1, electrodes EL11 are formed. Over each electrode EL11, a connection terminal CUP, which is a conductor post typified by a Cu pillar, is formed. The connection terminals CUP are coupled to electrodes IEL on the first surface of the wiring board IP with solder SLD1 therebetween. An insulating layer SR, such as a solder resist layer, is provided over the first surface of the wiring board IP. The insulating layer SR has an opening SRO at a position overlapping with the electrodes TEL. The periphery of the electrodes IEL may be covered with the insulating layer SR or may be exposed from the insulating layer SR.

Some electrodes EL11 are coupled through the lines and vias in the multilevel interconnection layer MIL1 to ends of the first through-silicon vias TSV1 on the side of the element formation surface SFC11. The other ends of the first through-silicon vias TSV1 on the side of the back surface SFC12 are coupled to connection terminals EL21 of the second semiconductor chip SC2 through solder SLD2.

In the example shown in FIG. 3, the connection terminals EL21 of the second semiconductor chip SC2 overlap with the first through-silicon vias TSV1 of the first semiconductor chip SC1 in plan view. However, at least some of the connection terminals EL21 do not need to overlap with the corresponding first through-silicon vias TSV1 in plan view. In this case, at least one wiring layer is formed over the back surface SFC12 of the first semiconductor chip SC1. Through the wiring layer, the connection terminals EL21 are coupled to the first through-silicon vias TSV1.

The first through-silicon vias TSV1 are arranged with a smaller pitch than the pitch between the connection terminals CUP. Arranging the connection terminals CUP with a relatively large pitch can make the connection terminals CUP thicker than the first through-silicon vias TSV1. Making the connection terminals CUP thicker can enhance the mechanical reliability when the first semiconductor chip SC1 is coupled to the wiring board IP. In addition, the connection terminals CUP can be increased in height. In the example shown in FIG. 3, in plan view, some of the first through-silicon vias TSV1 at least partially overlap with the connection terminals CUP. This can ease restrictions on the layout of the connection terminals CUP and the first through-silicon vias TSV1. Alternatively, the first through-silicon vias TSV1 can be designed not to overlap with any of the connection terminals CUP.

Figure 4:
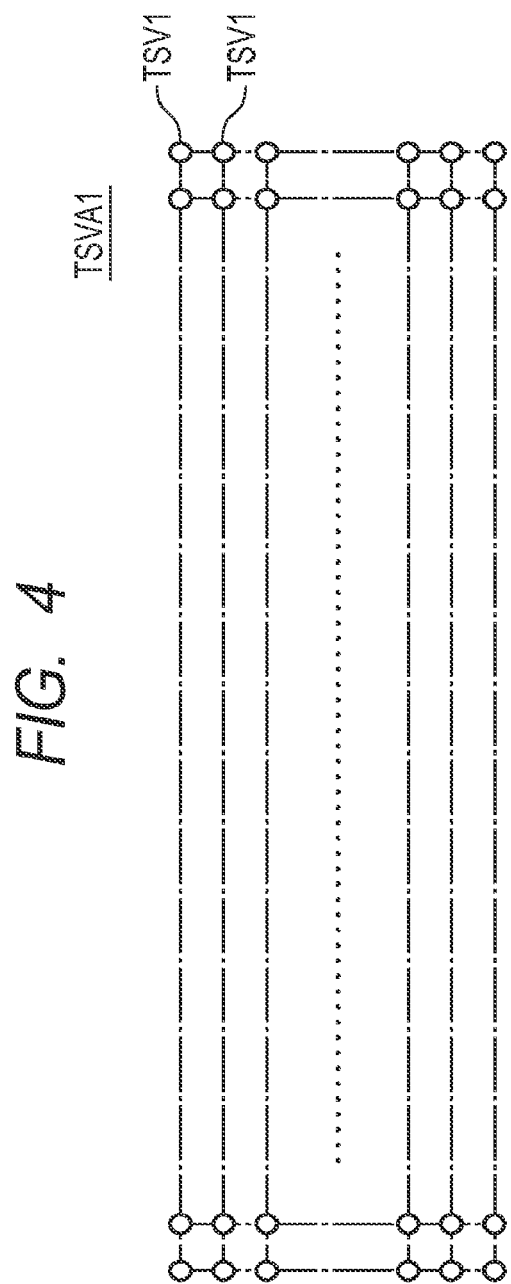
FIG. 4 illustrates an exemplary arrangement of first through-silicon vias in a through-silicon via area.

FIG. 4, illustrates an exemplary arrangement of the first through-silicon vias TSV1 in a through-silicon via area TSVA1. As shown in FIG. 4, the first through-silicon vias TSV1 are arranged on grid points, respectively, in the through-silicon via area TSVA1. The long side of the through-silicon via area TSVA1 is, for example, ten or more times longer than the short side thereof. In the grid pattern where the first through-silicon vias TSV1 are arranged, adjacent four grid points form, for example, a square, a rectangle, or a parallelogram, but the shape is not limited thereto. In addition, it is not necessary to arrange the first through-silicon vias TSV1 on all the grid points. The ratio of grid points on which the first through-silicon vias TSV1 are not arranged to all the grid points is, for example, 10% or less.

Figure 5:
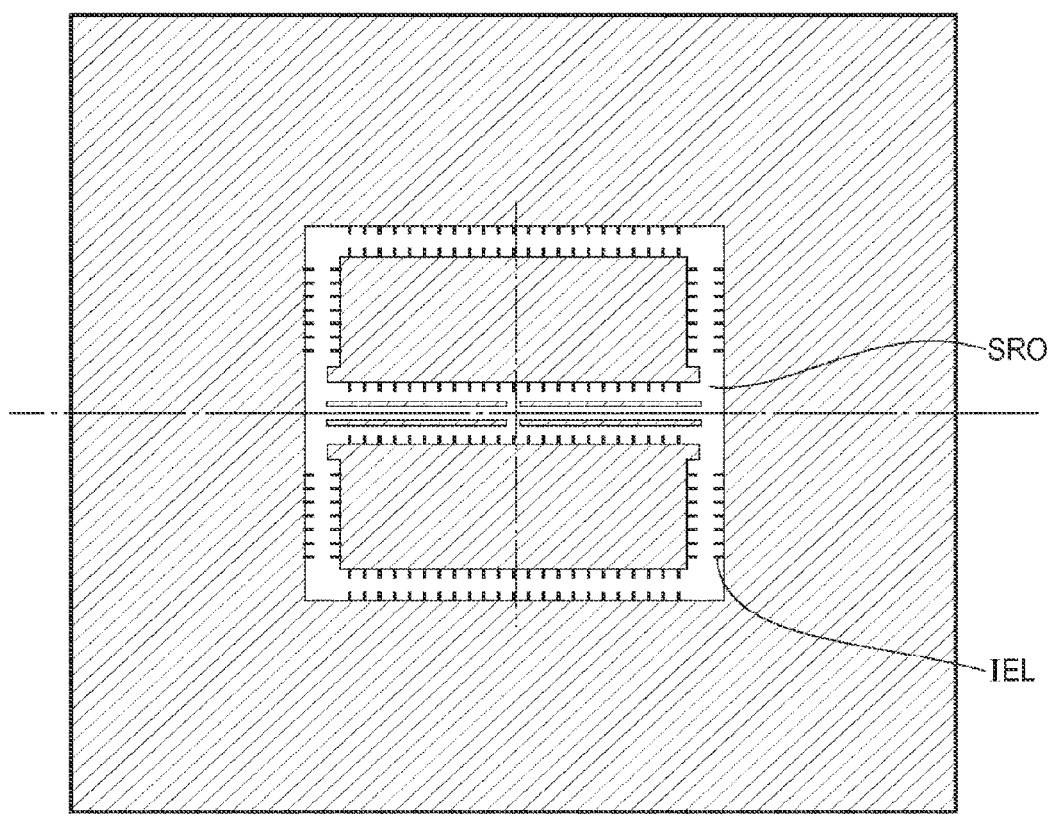
FIG. 5 illustrates an exemplary shape of an opening of the wiring board.

FIG. 5 illustrates an exemplary shape of the opening SRO of the wiring board IP. In the example shown in FIG. 5, the opening SRO is not provided for every single electrode IEL, but is provided as a common opening for plural electrodes IEL. Specifically, a first opening SRO is continuously formed along the edges of the wiring board IP so as to overlap with the electrodes IEL corresponding to the connection terminals CUP1. Then, a second opening SRO is formed at the center of the wiring board IP so as to overlap with electrodes IEL corresponding to the connection terminals CUP2 and electrodes IEL corresponding to connection terminals CUP3. In the example shown in FIG. 5, the ends of the second opening SRO are coupled to the first opening SRO. However, the first opening SRO and second opening SRO can be separated from each other. Alternatively, the second opening SRO can be split into plural openings that are each allocated to each through-silicon via area TSVA1.

Figure 7A:
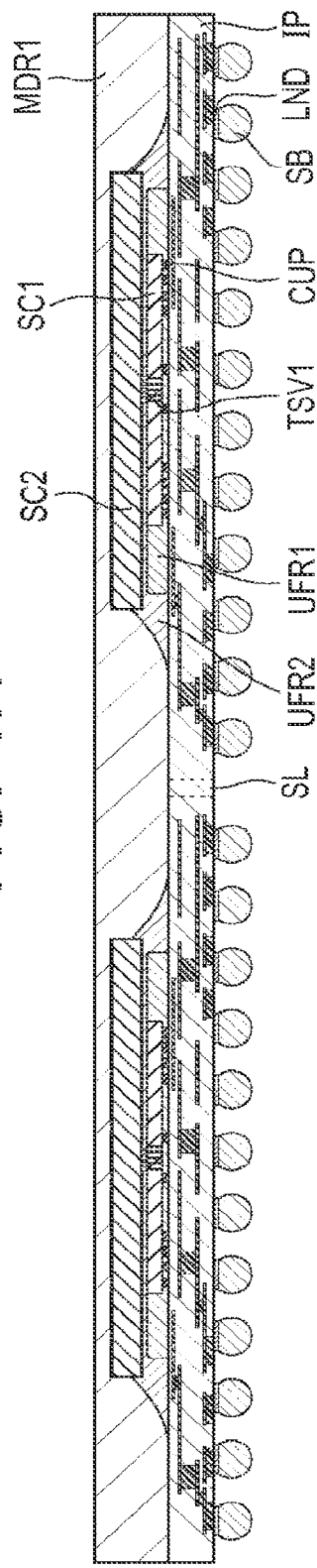
FIGS. 7A and 7B illustrate the method for manufacturing the semiconductor device.
Figure 7B:
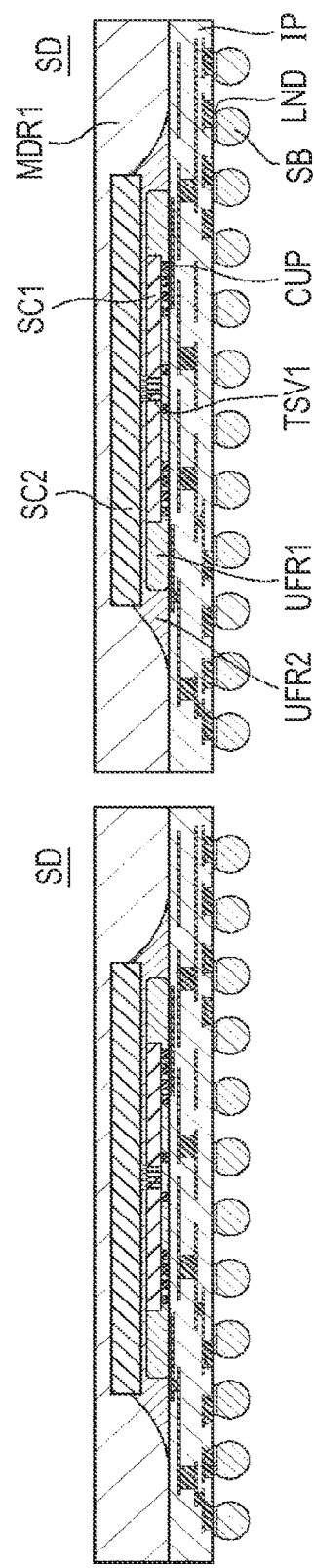
Figure 8:
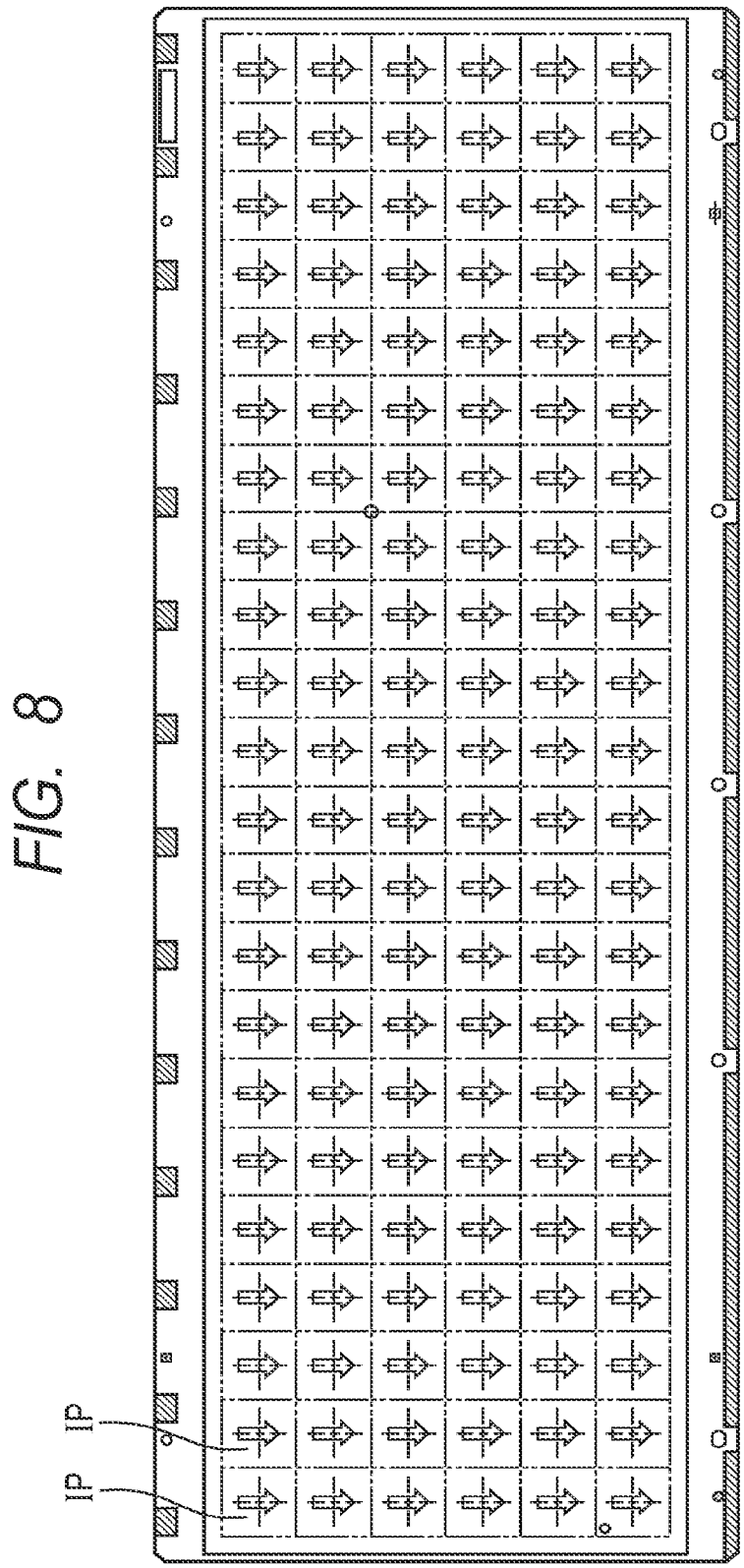
FIG. 8 is a plan view to illustrate the configuration of the wiring board.

Referring to FIGS. 6 to 8, a method for manufacturing the semiconductor device SD will be described. First, a first semiconductor chip SC1 and a second semiconductor chip SC2 are prepared. The first semiconductor chip SC1 and the second semiconductor chip SC2 are formed, for example, in the following manner.

First, an element isolation film is formed on a substrate in the form of a wafer (e.g., a substrate SUB1). With this element isolation film, element formation areas are isolated. The element isolation film is formed by, for example, an STI method, but also can be formed by a LOCOS method. Then, a gate insulating film and a gate electrode are formed in the element formation area of the substrate SUB1. The gate insulating film may be a silicon oxide film or a High-k dielectric film (e.g., a hafnium silicate film) with a dielectric constant higher than that of silicon oxide films. If the gate insulating film is a silicon oxide film, the gate electrode is made of a polysilicon film. If the gate insulating film is a High-k dielectric film, the gate electrode is made of a laminated film of a metal film (e.g., TiN) and a polysilicon film. In the case where the gate electrode is made of polysilicon, a polysilicon resistor can be formed over the element isolation film in the course of forming the gate electrode.

Next, an extension region for a source and a drain is formed in the element formation area of the substrate. Then, a sidewall is formed on the sides of the gate electrode. Then, an impurity region to be a source and a drain is formed in the element formation area of the substrate. Thus, a transistor (e.g., a transistor Tr1) is formed over the substrate.

Subsequently, a multilevel interconnection layer (e.g., multilevel interconnection layer MIL1) is formed over the element isolation film and transistors. Electrodes (e.g., electrodes EL11) are formed over the uppermost layer of the multilevel interconnection layer. Then, a protection insulating film (passivation film) is formed over the multilevel interconnection layer. An opening is formed in the protection insulating film over the electrodes.

In the course of forming the multilevel interconnection layer, a capacitative element, which serves as a memory cell, is also formed for the second semiconductor chip SC2.

Connection terminals CUP are formed over the electrodes EL11 of the first semiconductor chip SC1. If the connection terminals CUP are conductor posts, the connection terminals CUP are formed by, for example, plating. Over the connection terminals CUP, a solder layer is formed.

Then, first through-silicon vias TSV1 are formed in the first semiconductor chip SC1 at any point in time in the aforementioned steps. For example, the first through-silicon vias TSV1 may be formed before the transistor Tr1 is formed or after the electrode EL11 and protection insulating film have been formed. Alternatively, the first through-silicon vias TSV1 can be formed after the transistor Tr1 and multilevel interconnection layer have been partially formed. In this case, ends of the first through-silicon vias TSV1 on the side of the element formation surface SFC11 are coupled to any wiring layer of the multilevel interconnection layer. In addition, electrodes may be formed over the back surface SFC12 of the first semiconductor chip SC1 to couple to the first through-silicon vias TSV1, at any point in time.

Subsequently, the wafer is cut into semiconductor chips.

Wiring boards IP as shown in FIG. 8 are prepared. FIG. 8 shows that a plurality of wiring boards IP coupled to each other with scribe regions SL (see FIGS. 6A, 6B, 6C and other drawings).

Figure 6A:
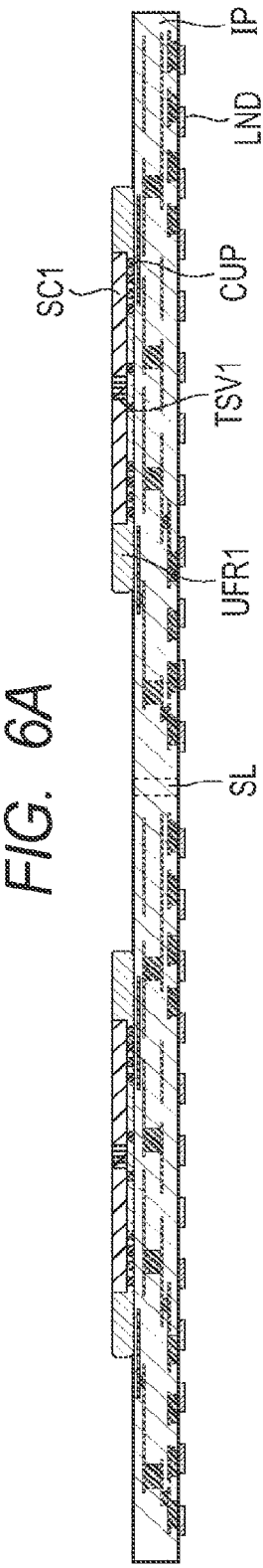
FIGS. 6A to 6C illustrate a method for manufacturing the semiconductor device.

Then, as shown in FIG. 6A, a first semiconductor chip SC1 is mounted over a wiring board IP. At this point, connection terminals CUP are coupled to electrodes IEL, and first sealing resin UFR1 is formed. The first sealing resin UFR1 can be formed by using film-shaped resin, such as a die attachment film (DAF), or can be formed by dripping liquid resin. In the former case, the first sealing resin UFR1 is applied over the wiring board IP before the first semiconductor chip SC1 is mounted over the wiring board IP. This can make it easier to form the planar shape of the first sealing resin UFR1 as described with reference to FIG. 2. In the latter case, the first sealing resin UFR1 is applied after the first semiconductor chip SC1 has been mounted over the wiring board IP. Also in the latter case, the end part of the first sealing resin UFR1 forms a fillet extending at least downward along the sides of the first semiconductor chip SC1.

Figure 6B:
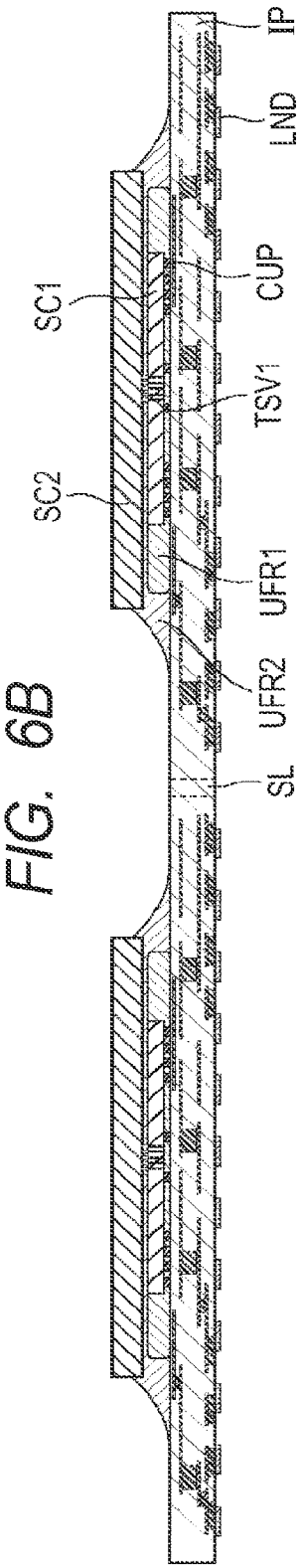

Next, as shown in FIG. 6B, a second semiconductor chip SC2 is mounted over the first semiconductor chip SC1. At this point, the first through-silicon vias TSV1 of the first semiconductor chip SC1 are coupled to the connection terminals EL21 of the second semiconductor chip SC2. The second sealing resin UFR2 is formed afterward. The second sealing resin UFR2 is formed, for example, by dripping liquid resin. Hence, the end part of the second sealing resin UFR2 forms a fillet extending at least downward along the sides of the second semiconductor chip SC2.

The steps shown in FIGS. 6A and 6B are performed on each of the wiring boards IP.

Figure 6C:
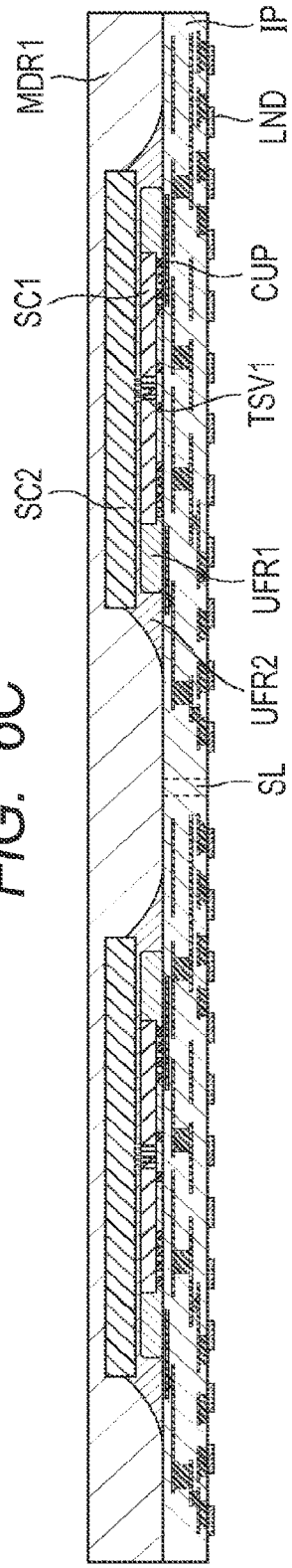

Subsequently, as shown in FIG. 6C, sealing resin MDR1 is formed. The sealing resin MDR1 is formed over the wiring boards IP all at once (batch molding method), for example, by using a single cavity (not shown) formed by a set of mold components (not shown).

In the step of forming the sealing resin MDR1, a cavity can be provided for every wiring board IP. In this case, a stack of the first semiconductor chip SC1 and the second semiconductor chip SC2 is sealed for every individual wiring board IP (individual molding method). In this case, since each of the wiring boards IP is covered with an individual cavity (not shown), the side surfaces of the wiring board IP are not flush with the side surfaces of the sealing resin MDR1.

Then, as shown in FIG. 7A, external connection terminals SB are provided to every wiring board IP.

Subsequently, as shown in FIG. 7B, the wiring boards IP and sealing resin MDR1 are divided along the scribe regions SL. Thus, the semiconductor devices SD are prepared.

Next, the main action and effects of this embodiment will be described. According to this embodiment, in plan view, some of the connection terminals CUP2 are positioned between the first circuit formation area LGC1 and the through-silicon via area TSVA1. This arrangement allows at least a portion of heat generated in the first circuit formation area LGC1 to transfer to the wiring board IP through the connection terminals CUP. Resultantly, heat transferring from the first semiconductor chip SC1 to the second semiconductor chip SC2 through the first through-silicon via TSV1 can be reduced. Especially, in this embodiment, the connection terminals CUP2 are arranged so as to surround the through-silicon via areas TSVA1 entirely. Therefore, the aforementioned effect is further enhanced.

[First Modification]

Figure 9:
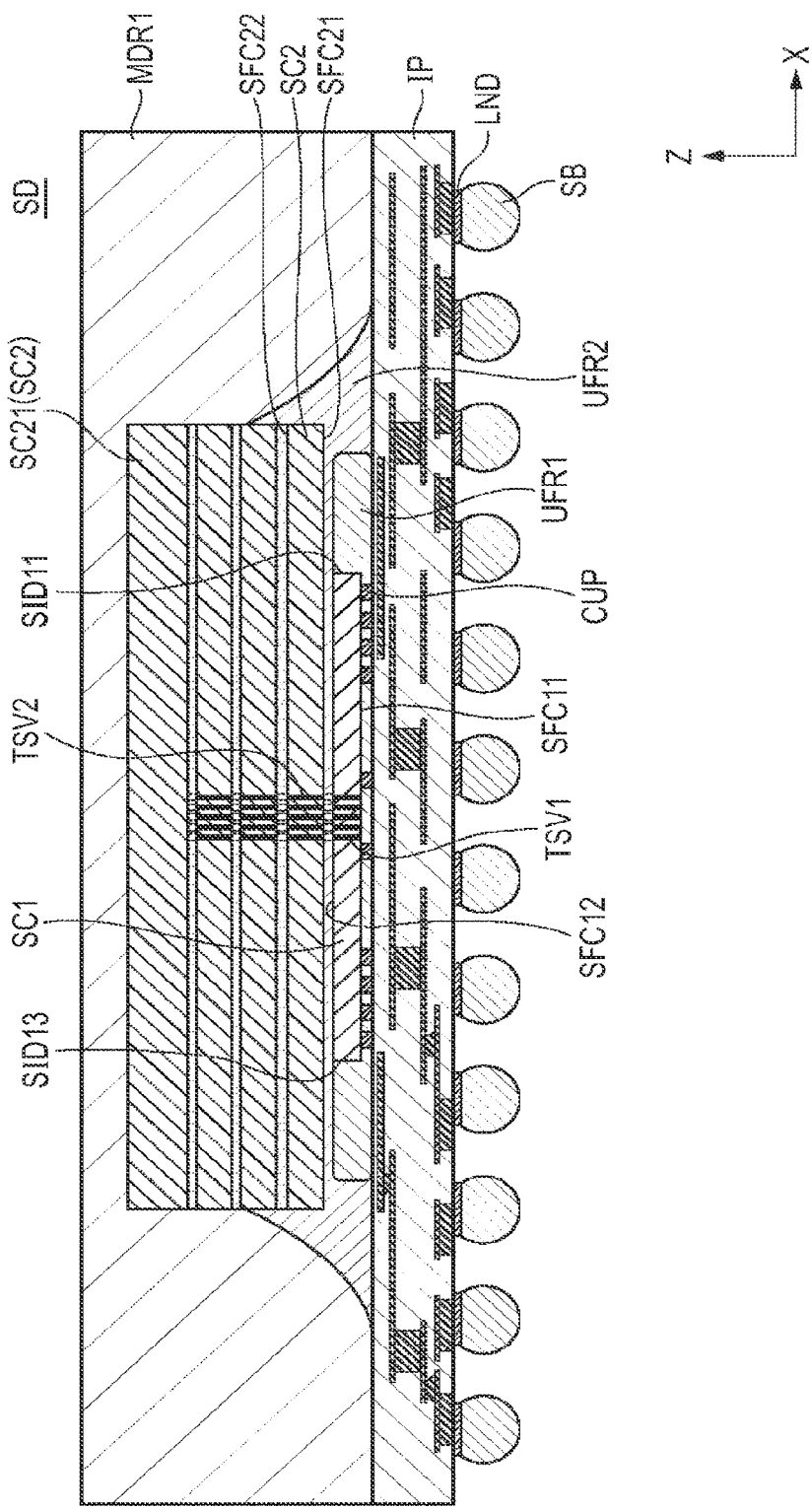
FIG. 9 is a cross-sectional view showing the configuration of a semiconductor device according to the first modification.

FIG. 9 is a cross-sectional view showing the configuration of a semiconductor device SD according to the first modification. The semiconductor device SD according to this modification has the same configuration as the semiconductor device SD of the embodiment except for the following.

The first difference is that the semiconductor device SD includes plural second semiconductor chips SC2. The second semiconductor chips SC2 are stacked on top of each other. At least one of the second or higher positioned second semiconductor chips SC2, for example, the uppermost second semiconductor chip SC21 is made thicker than the other second semiconductor chips SC2. However, the uppermost second semiconductor chip SC21 also can have the same thickness as the other second semiconductor chips SC2. The second semiconductor chips SC2 that are stacked on top of each other are stacked over the first semiconductor chip SC1.

Each of the second semiconductor chips SC2 has second through-silicon vias TSV2. The second through-silicon vias TSV2 couple one second semiconductor chip SC2 to another second semiconductor chip SC2 positioned thereabove. Thus, the first semiconductor chip SC1 is electrically coupled to the second or higher positioned second semiconductor chips SC2 through the second through-silicon vias TSV2. The second semiconductor chips SC2 are, for example, all memory chips. However, at least one of the second semiconductor chips SC2 may include a logic circuit. In the example shown in FIG. 9, the four sides of the respective second semiconductor chips SC2 overlap with each other in plan view. In addition, the second through-silicon vias TSV2 of the respective second semiconductor chips SC2 overlap with each other in plan view.

As viewed in plan view, at least some of the second through-silicon vias TSV2 overlap with any of the first through-silicon vias TSV1. Laying out the vias in the aforementioned manner can simplify the pattern of conductors between the second through-silicon vias TSV2 and the first through-silicon vias TSV1 coupled thereto.

In the example shown in FIG. 9, the second through-silicon vias TSV2 are arranged on the same grid points as the first through-silicon vias TSV1. The second semiconductor chips SC2 also have areas like the through-silicon via areas TSVA1. For instance, in the case where the second semiconductor chips SC2 are memory chips, the second through-silicon vias TSV2 are arranged in accordance with specifications set out in JEDEC JESD 229. The grids made by the array of the first through-silicon vias TSV1 overlap with the grids made by the array of the second through-silicon vias TSV2, respectively, in plan view.

Figure 10:
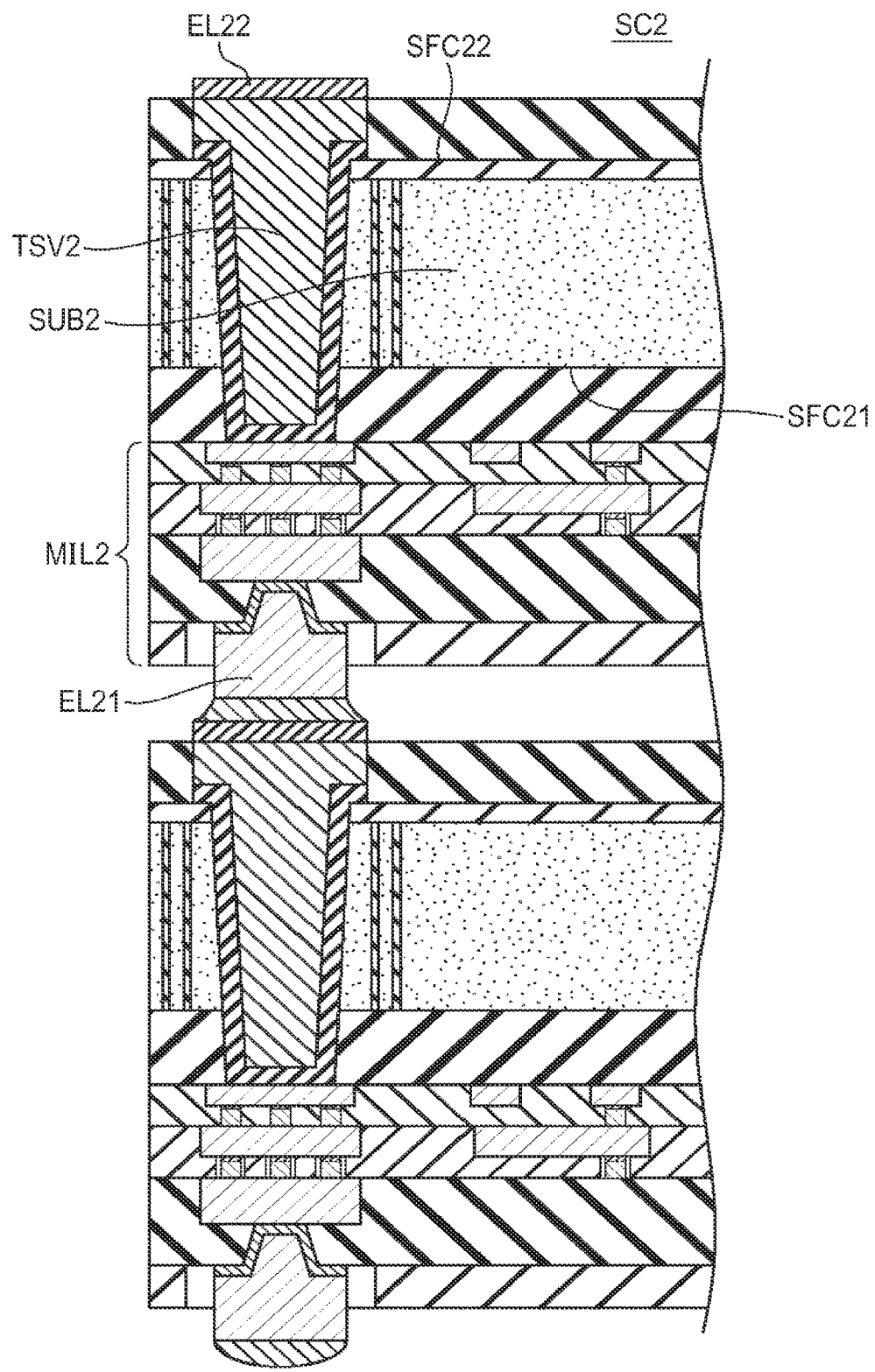
FIG. 10 illustrates the cross-sectional structure of second semiconductor chips.

FIG. 10 illustrates the cross-sectional structure of the second semiconductor chips SC2. In the example shown in FIG. 10, a second through-silicon via TSV2 is formed in a substrate SUB2 of a second semiconductor chip SC2. The second through-silicon via TSV2 is made of a conductive material, such as copper, and passes through the substrate SUB2. Also, an insulating film is embedded in the substrate SUB2 so as to surround the second through-silicon via TSV2. This insulating film may be thicker than the insulating film between the substrate SUB1 of the first semiconductor chip SC1 and the first through-silicon via TSV1.

Over an element formation surface SFC21 of the substrate SUB2, a multilevel interconnection layer MIL2 is formed. The second through-silicon via TSV2 is coupled to a connection terminal EL21 provided over the multilevel interconnection layer MIL2 through vias or the like in the multilevel interconnection layer. The connection terminal EL21 is, for example, a conductor post made of copper or other materials. In addition, an electrode EL22 is formed over the back surface SFC22 of the substrate SUB2. The electrode EL22 is coupled to the second through-silicon via TSV2.

The method for manufacturing the semiconductor device SD according to the first modification is the same as that according to the first embodiment, except that the second semiconductor chips SC2 are stacked on top of each other in advance.

The first modification can also provide the same effect as the embodiment. In addition, making the insulating film, which surrounds the second through-silicon via TSV2 in the substrate SUB2 of the second semiconductor chip SC2, thicker than the insulating film between the substrate SUB1 of the first semiconductor chip SC1 and the first through-silicon via TSV1 can reduce the amount of heat flowing into the substrate SUB2 through the first through-silicon vias TSV1 and the second through-silicon vias TSV2.

[Second Modification]

Figure 11:
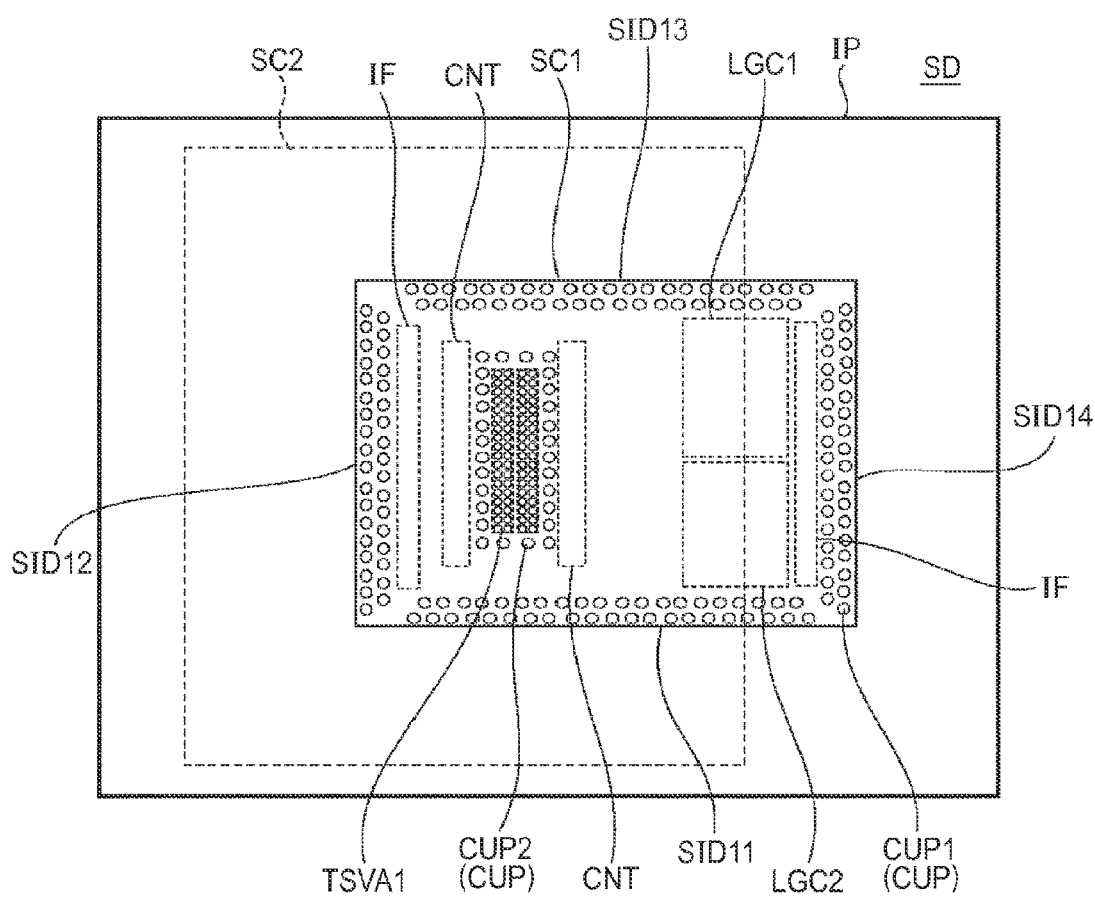
FIG. 11 is a plan view showing the configuration of a semiconductor device according to the second modification.

FIG. 11 is a plan view showing the configuration of a semiconductor device SD according to the second modification. The semiconductor device SD according to this modification has the same configuration as the embodiment or the first modification except for the following.

As viewed in a cross section taken along a short side of the through-silicon via area TSVA1, the center of the through-silicon via area TSVA1 is off center of the first semiconductor chip SC1 in an opposite direction to the first circuit formation area LGC1. Especially in this cross section, it is preferable that the center of the first semiconductor chip SC1 is not aligned with the center of the through-silicon via area TSVA1.

Also in this cross section, the first circuit formation area LGC1 is arranged on one side with respect to the center of the wiring board IP and the through-silicon via area TSVA1 is arranged on the other side.

With respect to the through-silicon via area TSVA1, the second circuit formation area LGC2 is placed on the same side as the first circuit formation area LGC1. In plan view, at least a part of the first circuit formation area LGC1 does not overlap with the second semiconductor chip SC2. Also, at least a part of the second circuit formation area LGC2 does not overlap with the second semiconductor chip SC2 in plan view.

In the aforementioned cross section, the center of the second semiconductor chip SC2 is off center of the wiring board IP. This arrangement can make the distance from at least one side surface of the second semiconductor chip SC2 to a side surface of the semiconductor device SD shorter, thereby making it easy to discharge heat of the second semiconductor chip SC2 from the side surface of the semiconductor device SD.

Also, in this cross section, the distance from the center of the second semiconductor chip SC2 to the center of the wiring board IP is shorter than the distance from the first semiconductor chip SC1 to the center of the wiring board IP.

If the first semiconductor chip SC1 is divided by an area, which is made by extending the through-silicon via area TSVA1 in parallel with the long sides of the through-silicon via area TSVA1, an area including the first circuit formation area LGC1 has more connection terminals CUP in number than the other area. This arrangement allows the heat from the first circuit formation area LGC1 to easily escape through the connection terminals CUP to the wiring board IP.

The second modification can also provide the same effect as the embodiment or the first modification. As viewed in a cross section taken along a short side of the through-silicon via area TSVA1, the center of the through-silicon via area TSVA1 is off center of the first semiconductor chip SC1 in an opposite direction to the first circuit formation area LGC1. Hence, the distance between the first circuit formation area LGC1 and through-silicon via area TSVA1 can be still increased. Therefore, the heat that is generated in the first circuit formation area LGC1 and reaches the second semiconductor chip SC2 through the first through-silicon via TSV1 can be further reduced. In the aforementioned cross section, the center of the second semiconductor chip SC2 is preferably aligned with the through-silicon via area TSVA1. This arrangement can smooth the temperature distribution in the second semiconductor chip SC2.

In addition, the distance from the center of the second semiconductor chip SC2 to the center of the wiring board IP is shorter than the distance from the first semiconductor chip SC1 to the center of the wiring board IP. Accordingly, at least one side surface of the second semiconductor chip SC2 can be placed near a side surface of the semiconductor device SD. Therefore, the heat of the second semiconductor chip SC2 can be easily discharged from the side surface of the semiconductor device SD.

In addition, with respect to the through-silicon via area TSVA1, the second circuit formation area LGC2 is placed on the same side as the first circuit formation area LGC1. Hence, the area of the the first semiconductor chip SC1 where the first circuit formation area LGC1 and second circuit formation area LGC2 are located increases in temperature, thereby making the temperature gradient greater between the first semiconductor chip SC1 and resin around the first semiconductor chip SC1. As a result, the amount of heat escaping out of the first semiconductor chip SC1 can be increased.

[Third Modification]

Figure 12:
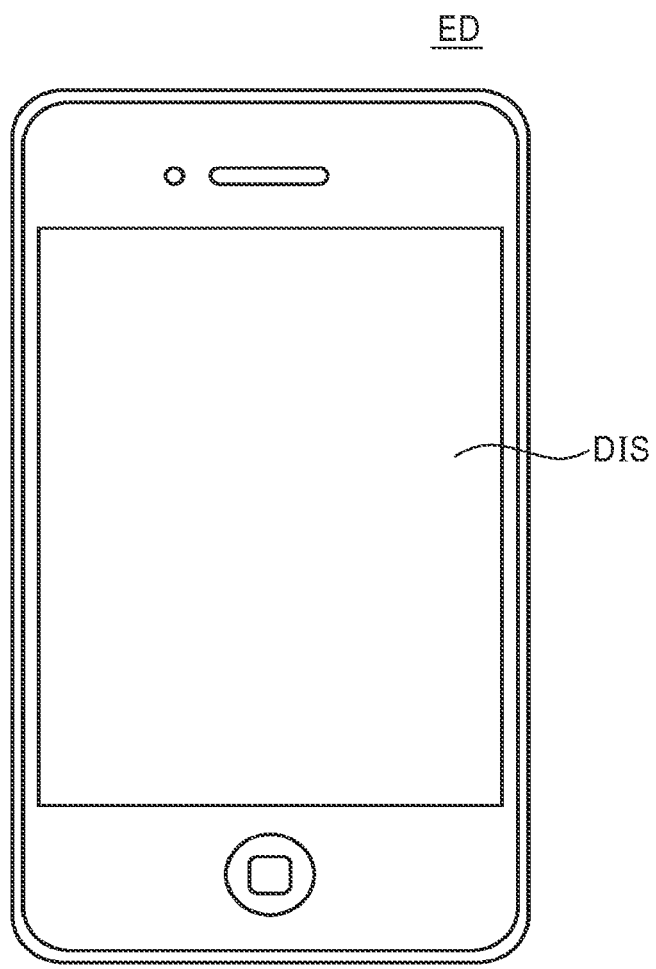
FIG. 12 is a plan view of an electronic device according to the third modification.

FIG. 12 is a plan view of an electronic device ED according to the third modification. The electronic device ED shown in FIG. 12 is a portable electronic device, such as a portable communication terminal, a portable video game console, and a portable personal computer, and includes the semiconductor device SD. The electronic device ED also includes a display DIS. The display DIS is controlled by using the semiconductor device SD.

FIG. 13 is a block diagram showing a functional configuration of the electronic device ED. In the example shown in FIG. 13, the second semiconductor chip SC2 is a memory chip. The first semiconductor chip SC1 uses the second semiconductor chip SC2 to control the electronic device ED. The first circuit formation area LGC1 of the first semiconductor chip SC1 is a core central processing unit (CPU), and the second circuit formation area LGC2 of the first semiconductor chip SC1 is a graphic processing unit (GPU). The first semiconductor chip SC1 further includes plural circuitry areas LGC3, LGC4 (e.g., a modem circuit, speech processing circuit, etc.). The electronic device ED also includes a non-volatile memory (NVM).

The first semiconductor chip SC1 communicates with a communication unit (either wired or wireless), a communication interface for wireless tag, such as RFIC, an analog-to-digital converter, a digital-to-analog converter, a power controller, an SIM card, an image pickup unit, a memory card, a user input unit (e.g., keypad), a USB communication unit, and an NVM.

It should be further understood by those skilled in the art that although the foregoing description has been made on an embodiment of the invention, the invention is not limited thereto and various changes and modifications may be made without departing from the spirit of the invention and the scope of the appended claims.

What is claimed is:

1. A semiconductor device comprising:
a wiring board including a first surface over which an electrode is formed;
a first semiconductor chip including:
a second surface over which a first connection terminal is formed,
a third surface opposite to the second surface,
a through-silicon via, and
a first circuit; and
a second semiconductor chip including a fourth surface over which a third connection terminal is formed;
wherein the first semiconductor chip is mounted over the wiring board such that the second surface of the first semiconductor chip faces the first surface of the wiring board,
wherein the second semiconductor chip is mounted over the first semiconductor chip such that the fourth surface of the second semiconductor chip faces the third surface of the first semiconductor chip,
wherein the first connection terminal of the first semiconductor chip is electrically coupled with the electrode of the wiring board,
wherein the through-silicon via of the first semiconductor chip is electrically coupled with the third connection terminal of the second semiconductor chip,
wherein the first circuit of the first semiconductor chip is electrically coupled with the through-silicon via, and
wherein the first connection terminal is located between the first circuit and the through-silicon via in plan view.

2. The semiconductor device according to claim 1, wherein the first circuit of the first semiconductor chip is one of a central processing unit and a graphics processing unit.

3. The semiconductor device according to claim 2, further comprising:
a second connection terminal formed over the second surface of the first semiconductor chip,
wherein the second connection terminal is located farther from the through-silicon via than the first connection terminal in the plan view, and
wherein in the plan view, the first circuit is located between the first connection terminal and the second connection terminal such that the first circuit does not overlap with both the first and second connection terminals.

4. The semiconductor device according to claim 3, wherein a cross-sectional area of the first connection terminal is greater than a cross-sectional area of the second connection terminal.

5. The semiconductor device according to claim 2, wherein the first semiconductor chip is thinner than the second semiconductor chip.

6. The semiconductor device according to claim 2, wherein a first space between the second surface of the first semiconductor chip and the first surface of the wiring board is thinner than a second space between the third surface of the first semiconductor chip and the fourth surface of the second semiconductor chip in a thickness direction of the first semiconductor chip.

7. The semiconductor device according to claim 6, further comprising:
a first sealing resin sealing the first space; and
a second sealing resin sealing the second space,
wherein a thermal conductivity of the first sealing resin is higher than a thermal conductivity of the second sealing resin.

8. The semiconductor device according to claim 2, wherein the second semiconductor chip is a memory chip,
wherein the first semiconductor chip includes a second circuit to control the memory of the second semiconductor chip, and
wherein the second circuit is located between the first circuit and the first connection terminal in the plan view.

9. A semiconductor device comprising:
a wiring board including a first surface over which a plurality of electrodes are formed;
a first semiconductor chip including:
a second surface over which a plurality of connection terminals are formed,
a third surface opposite to the second surface,
a plurality of through-silicon vias, and
a first circuit; and
a second semiconductor chip including a fourth surface over which a plurality of third connection terminals are formed;
wherein the first semiconductor chip is mounted over the wiring board such that the second surface of the first semiconductor chip faces the first surface of the wiring board,
wherein the second semiconductor chip is mounted over the first semiconductor chip such that the fourth surface of the second semiconductor chip faces the third surface of the first semiconductor chip,
wherein each of the connection terminals are electrically coupled with each of the electrodes,
wherein each of the through-silicon vias is electrically coupled with each of the third connection terminals,
wherein the first circuit is electrically coupled with the second semiconductor chip,
wherein the connection terminals include a plurality of first connection terminals arranged around an area in which the through-silicon vias are formed, and
wherein the first circuit is located outside of both the first connection terminals and said area in plan view.

10. The semiconductor device according to claim 9, wherein the through-silicon vias are arranged in a matrix of m rows and n columns (m>n) in plan view,
wherein n is greater than 1, and
wherein the area is defined by an extended line coupling outermost through-silicon vias.

11. The semiconductor device according to claim 10, wherein the first connection terminals are located between the first circuit and the area in the plan view.

12. The semiconductor device according to claim 11, wherein the first semiconductor chip includes a first side, a second side opposite the first side, a third side, and a fourth side opposite the third side,
wherein the first and second sides extend along a first direction,
wherein the third and fourth sides extend along a second direction perpendicular to the first direction,
wherein the first side is shorter than the third side in the plan view, and
wherein each column of the n columns is substantially parallel to the first side of the first semiconductor chip in the plan view.

13. The semiconductor device according to claim 11, wherein the first semiconductor chip includes a first side, a second side opposite the first side, a third side, and a fourth side opposite the third side,
wherein the first and second sides extend along a first direction,
wherein the third and fourth sides extend along a second direction perpendicular to the first direction, in the plan view,
wherein the connection terminals include a plurality of second connection terminals arranged along the first side of the first semiconductor chip,
wherein the second connection terminals are located farther from the area than the first connection terminals in the second direction, and
wherein the first circuit is located between the first connection terminals and the second connection terminals in the plan view.

14. The semiconductor device according to claim 13, wherein the first side is shorter than the third side in the plan view.

15. The semiconductor device according to claim 13, wherein a cross-sectional area of each of the first connection terminals is greater than a cross-sectional area of each of the second connection terminals.

16. The semiconductor device according to claim 11, wherein the first circuit of the first semiconductor chip is one of a central processing unit and a graphics processing unit.

17. The semiconductor device according to claim 16, wherein the second semiconductor chip is a memory chip,
wherein the first semiconductor chip includes a second circuit to control the memory of the second semiconductor chip, and
wherein the second circuit is located between the first circuit and the first connection terminals in the plan view.

18. The semiconductor device according to claim 11, wherein the first semiconductor chip is thinner than the second semiconductor chip.

19. The semiconductor device according to claim 11, wherein a first space between the second surface of the first semiconductor chip and the first surface of the wiring board is thinner than a second space between the third surface of the first semiconductor chip and the fourth surface of the second semiconductor chip in a thickness direction of the first semiconductor chip.

20. The semiconductor device according to claim 19, further comprising:
a first sealing resin sealing the first space; and
a second sealing resin sealing the second space,
wherein a thermal conductivity of the first sealing resin is higher than a thermal conductivity of the second sealing resin.

* * * * *